United States Patent [19]
Lari et al.

[11] Patent Number: 5,401,995
[45] Date of Patent: Mar. 28, 1995

[54] CIRCUIT WITH DIODE-PROTECTED EMITTER RESISTORS

[75] Inventors: Ferdinando Lari, Vimercate; Pietro Erratico, Milan, both of Italy

[73] Assignee: SGS-Thomson Microelectronics, S.r.l., Agrate Brianza, Italy

[21] Appl. No.: 99,854

[22] Filed: Jul. 30, 1993

[51] Int. Cl.$^6$ ............... H01L 29/72; H01L 27/02
[52] U.S. Cl. .................... 257/539; 257/543; 257/568; 330/254; 330/255; 330/257; 330/261
[58] Field of Search ............ 257/568, 577, 539, 543; 330/252, 254, 255, 257, 258, 261

[56] References Cited

U.S. PATENT DOCUMENTS

| | | | |
|---|---|---|---|
| 4,413,237 | 11/1983 | Baba | 257/577 |
| 4,463,319 | 7/1984 | Kearney | 330/261 |
| 4,547,743 | 10/1985 | Goto | 257/577 |
| 4,607,232 | 8/1986 | Gill, Jr. | 330/261 |
| 4,871,977 | 10/1989 | Schilling et al. | 257/577 |
| 4,929,910 | 5/1990 | Pace et al. | |
| 5,142,242 | 8/1992 | Schaffer | 330/257 |
| 5,168,243 | 12/1992 | Feliz et al. | 330/257 |
| 5,168,244 | 12/1992 | Muranaka | 330/257 |

OTHER PUBLICATIONS

Instruments and Experimental Techniques, vol. 21, No. 2, Mar. 1978, New York US, pp. 429–430; N. N. Prokopenko 'Differential Operational Amplifier with Improved Response Time' *the whole document*.
Patent Abstracts of Japan, vol. 13, No. 439 (E-827) Oct. 3, 1989 & JP-A-11 68 052 (Mitsubishi Electric Corp.) Jul. 3, 1989 *abstract*.
Patent Abstracts of Japan, vol. 15, No. 054 (E-1031) Feb. 8, 1991 & JP-A-22 83-070 (Fuji Electric Co) Nov. 20, 1990 *abstract*.

*Primary Examiner*—Ngan Van Ngo
*Attorney, Agent, or Firm*—Robert Groover

[57] ABSTRACT

An operational amplifier, of a type which comprises a differential cell transconductor input stage (2) incorporating a current mirror (5) provided with a pair of degenerative resistors (R9,R10) and a gain stage (7), driven directly by a transistor (Q12) of said mirror (5), has each degenerative resistor (R9,R10) formed within an epitaxial well wherewith a parasitic diode (D1,D2) is associated. Each diode (D1,D2) is connected in parallel with its corresponding resistor (R9,R10) to prevent the transistor (Q12) which drives the gain stage (7) from becoming saturated.

36 Claims, 2 Drawing Sheets

CIRCUIT WITH DIODE-PROTECTED EMITTER RESISTORS

CROSS-REFERENCE TO RELATED APPLICATION

This application claims priority from EPC App'n 92830433.6, filed July 31, 1992, which is hereby incorporated by reference.

BACKGROUND AND SUMMARY OF THE INVENTION

This invention relates to an operational amplifier of a type which comprises a differential cell transconductor input stage incorporating a current mirror provided with a pair of degenerative resistors and a gain stage directly driven by a transistor in said mirror.

The construction of amplifiers of the above type is usually completed by an output buffer connected after the gain stage and fed back to one of the signal inputs.

As is well known, in the specific field of application of this invention, there exists a demand for optimization of the amplifier input stage performance.

For that purpose, two so-called degenerative resistors are usually provided which are respectively associated with corresponding input and output legs of the current mirror incorporated to the input stage.

The current mirror is typically sized so that, in normal operation, the voltage across each of the resistors is approximately 200 mV. In this way, the collector/emitter voltage of the transistor which drives the gain stage can be held at a value of about 1.2 Volts, thereby preventing it from becoming saturated.

It may happen, however, that under some particular operating conditions, such as on the sudden occurrence of deep variations in the supply voltage, "breakdowns" appear in the npn or pnp junctions of the transistors incorporated to the input stage. This generates high breakdown currents which propagate to the current mirror and cause the transistor driving the gain stage to become saturated. The gain stage usually comprises a pair of transistors connected together into a Darlington configuration.

If this stage is driven into powerful conduction, it will in turn drive the output buffer to potentials close to the value of the negative supply voltage, e.g. the ground value.

If, as is often the case, the amplifier includes a feedback connection between its output and inverting input, then this input will also be driven to a potential close to the ground value, thereby holding the breakdown currents.

All this results in a "latch-up" state of the device, which is thereafter stuck for as long as power is present.

To avoid such a serious drawback, the prior art has proposed of connecting a diode in parallel with one of the degenerative resistors, namely that associated with the input leg of the current mirror.

In practice, this diode is formed by an npn transistor having its base shorted to the collector and connected between one end of said resistor and ground.

While being in several ways beneficial and substantially achieving its objective, this prior approach requires the provision of an additional element for which a suitable area must be reserved on the amplifier integrated circuit.

The underlying technical problem of this invention is to provide an improved amplifier which has such constructional and functional features as to overcome the limitations to prior art solutions, while minimizing the area to be occupied on the amplifier integrated circuit.

The solutive idea on which this invention stands is one of exploiting a parasitic diode associated with the degenerative resistors.

In the presently preferred embodiment, the technical problems are solved by an operational amplifier, of a type which comprises a differential cell transconductor input stage incorporating a current mirror provided with a pair of degenerative resistors and a gain stage, driven directly by a transistor of the mirror, has each degenerative resistor formed within an epitaxial well wherewith a parasitic diode is associated. Each diode is connected in parallel with its corresponding resistor to prevent the transistor which drives the gain stage from becoming saturated.

According to innovative teachings disclosed herein, there is provided: An integrated circuit, comprising: first and second matched branches, each the branch including respective first and second transistors, both the first transistors having respective control terminals which are connected in common, and at least one the second transistor being connected to receive an input signal; each the first transistor having a second terminal thereof connected through a respective degeneration resistor to a node which is common to the first and second branches; wherein the degeneration resistors are each formed by a diffusion of first conductivity type within a shared monolithic semiconductor well region of a second conductivity type; and wherein the well region overlies a buried layer of the second conductivity type which is more heavily doped than the well region; and wherein the well region and the buried layer overly a deeper region which is doped with the first conductivity type; and wherein the well region is laterally surrounded by a diffusion of the first conductivity type; and wherein no active devices are located in the well region with the resistors; and further comprising biasing circuitry connected to bias the first transistors at a level such that the junction between the first conductivity-type diffusion and the well region limits the voltage across the degeneration resistors and thereby prevents the transistors from going into saturation.

According to innovative teachings disclosed herein, there is provided: An integrated circuit, comprising: two matched bipolar transistors having respective bases thereof connected in common; each the transistor having an emitter thereof connected through a respective emitter degeneration resistor to a common node; wherein the degeneration resistors are each formed by a diffusion of first conductivity type within a shared monolithic semiconductor well region of a second conductivity type; and wherein the well region overlies a buried layer of the second conductivity type which is more heavily doped than the well region; and wherein the well region and the buried layer overly a deeper region which is doped with the first conductivity type; and wherein the well region is laterally surrounded by a diffusion of the first conductivity type; and wherein no active devices are located in the well region with the resistors; and further comprising biasing circuitry connected to bias the bipolar transistors at a level such that the junction between the first conductivity-type diffusion and the well region limits the voltage across the degeneration resistors and thereby prevents the transistors from going into saturation.

According to innovative teachings disclosed herein, there is provided: An integrated circuit, comprising: first and second matched branches, each the branch including respective first and second transistors, both the first transistors having respective control terminals which are connected in common, and at least one the second transistor being connected to receive an input signal; each the first transistor having a second terminal thereof connected through a respective degeneration resistor to a node which is common to the first and second branches; wherein the degeneration resistors are each formed by a diffusion of first conductivity type within a shared monolithic semiconductor well region of a second conductivity type; and wherein no active devices are located in the well region with the resistors; and further comprising biasing circuitry connected to bias the first transistors at a level such that the junction between the first conductivity-type diffusion and the well region limits the voltage across the degeneration resistors and thereby prevents the transistors from going into saturation.

According to innovative teachings disclosed herein, there is provided: An integrated circuit, comprising: two matched bipolar transistors having respective bases thereof connected in common; each the transistor having an emitter thereof connected through a respective emitter degeneration resistor to a common node; wherein the degeneration resistors are each formed by a diffusion of first conductivity type within a shared monolithic semiconductor well region of a second conductivity type; and wherein no active devices are located in the well region with the resistors; and further comprising biasing circuitry connected to bias the bipolar transistors at a level such that the junction between the first conductivity-type diffusion and the well region limits the voltage across the degeneration resistors and thereby prevents the transistors from going into saturation.

According to innovative teachings disclosed herein, there is provided: An operational amplifier of a type which comprises a differential cell transconductor input stage incorporating a current mirror provided with a pair of degenerative resistors, and a gain stage driven directly by a transistor in the mirror, wherein each degenerative resistor is implemented within an epitaxial well wherewith a parasitic diode is associated, and each the diode is connected in parallel with a corresponding one of the resistors.

The features and advantages of an amplifier according to this invention will be apparent from the following detailed description of an embodiment thereof, given by way of example and not of limitation with reference to the accompanying drawings.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
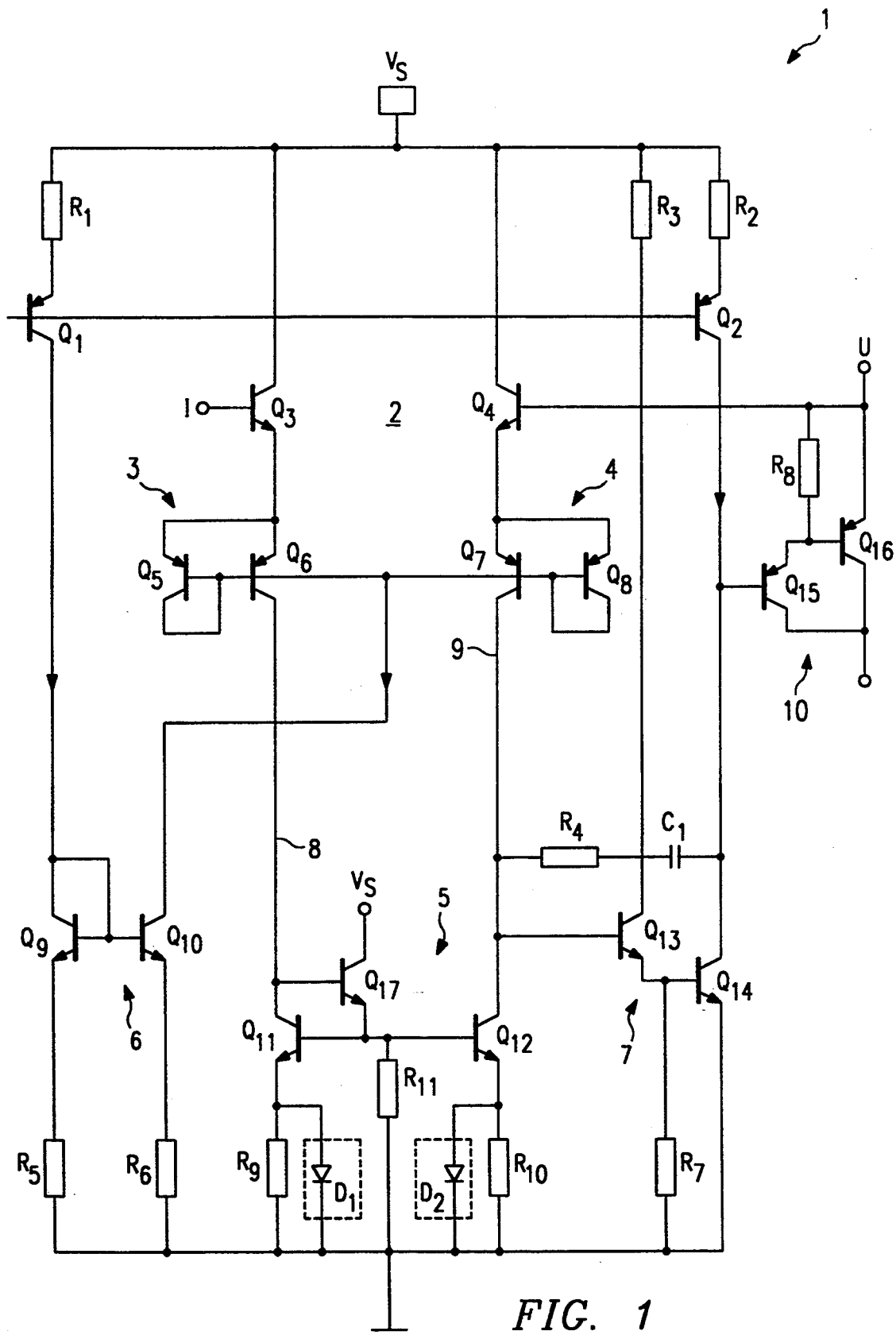
FIG. 1 is a diagrammatic representation of an amplifier embodying this invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing views, generally and schematically shown at 1 is an operational amplifier embodying this invention.

This amplifier 1 comprises a differential cell input stage 2 which incorporates a pair of bipolar transistors $Q_3$, $Q_4$ of the npn type connected in common collector configuration to a voltage supply Vs.

The respective bases of such transistors are the input terminals of stage 2. More particularly, the base of transistor $Q_3$ provides the non-inverting (+) input of the amplifier, while the base of $Q_4$ is the inverting (−) input.

Each of the two transistors $Q_3$, $Q_4$ has a corresponding emitter, connected to a current mirror circuit portion. The bias currents through transistors $Q_3$ and $Q_4$ is 25 μA, in the presently preferred embodiment, but of course other values can readily be substituted by those skilled in the art.

The emitter of $Q_3$ is associated with a current mirror 3, and the emitter of $Q_4$ is associated with a corresponding current mirror 4.

Each of said current mirrors 3, 4 is composed of a pair of pnp bipolar transistors, one of which is in diode configuration.

Thus, a first pair $Q_5$, $Q_6$ form the current mirror 3, and a second pair $Q_7$, $Q_8$ form the other current mirror 4.

The transistors of both pairs $Q_5$, $Q_6$ and $Q_7$, $Q_8$ have their bases in common and connected to the collector of an npn transistor $Q_{10}$ having its emitter connected to ground via a 0.5 kΩ resistor $R_6$. The base of transistor $Q_{10}$ is in common with the base of another npn transistor $Q_9$ which, with $Q_{10}$, forms a current mirror 6. The transistor $Q_9$ is in a diode configuration (having its base and collector in common), and its emitter is connected to ground via a resistor $R_5$ of 1 kΩ. The collector of $Q_9$ is also connected to the collector $C_1$ of a bias transistor $Q_1$ of the pnp type which is connected to the voltage supply Vs through its emitter and a resistor $R_1$ of 4 kΩ.

Advantageously, the input stage 2 of the amplifier 1 comprises a further current mirror circuit portion 5 having input and output legs 8 and 9 associated with each of the non-inverting (+) and inverting (−) signal inputs, respectively. This current mirror 5 comprises a pair of transistors $Q_{11}$ and $Q_{12}$ having their bases in common and being connected to ground through a resistor $R_{11}$. The second, $Q_{12}$, of such transistors is intended for driving a gain stage 7 connected after the input stage 2.

A third transistor $Q_{17}$ of the npn type passes base current to the transistors $Q_{11}$, $Q_{12}$, and has its base connected to the collector of the first transistor $Q_{11}$ in the mirror 5. The collectors of transistors $Q_{11}$ and $Q_{12}$ are connected, respectively, to the current mirror 3 and to the current mirror 4. The emitters of transistors $Q_{11}$, $Q_{12}$ are instead connected to ground through respective so-called degenerative resistors $R_9$, $R_{10}$. (The values of these, in the presently preferred embodiment, are $R_9 = R_{10} = 9$ k$\Omega$, but of course other values can be used instead in any particular circuit design.) These degenerative resistors are included to optimize the performance of the current mirror 5.

The aforesaid gain stage 7 comprises a pair of transistors $Q_{13}$, $Q_{14}$, both of the npn type, connected in a Darlington configuration.

Transistor $Q_{13}$ in the stage 7 has its base connected to the collector of transistor $Q_{12}$, its emitter connected to ground through a resistor $R_7$ of 18 k$\Omega$, and its collector connected to the supply Vs through another resistor $R_3$ of 10 k$\Omega$. The other transistor $Q_{14}$ of the Darlington pair has its emitter connected to ground and its collector $C_{14}$ connected both to the base of transistor $Q_{13}$ through the $R_C$ series between a capacitor C and a resistor $R_4$ of 0.5 k$\Omega$, and to a bias transistor $Q_2$ connected in parallel with transistor $Q_1$ via a 2 k$\Omega$ resistor $R_2$.

The collector of transistor $Q_{14}$ is also connected to an output buffer 10 comprising, in turn, a pair of transistors $Q_{15}$, $Q_{16}$ in Darlington configuration having their collectors in common. The emitter of $Q_{16}$ is connected to the inverting (−) input of the stage 2, and the emitter of $Q_{15}$ is connected to the inverting (−) input of the stage 2 through a 20 k$\Omega$ resistor $R_8$. These emitters provide an output terminal U for the amplifier 1.

Reverting now to the construction of the current mirror 5 incorporated to the input stage 2, it should be noted that the degenerative resistors $R_9$, $R_{10}$ are implemented in monolithic form within an epitaxial well 11 doped N-. The well 11 is formed above a P-type semiconductor substrate 12 with the partial interposition of an n+ buried layer 13. These resistors are formed by a diffusion process, e.g. using the same P-dope diffusion step as used to form the common base for the npn transistors $Q_{11}$ and $Q_{12}$. Alternatively, the resistors could be formed by P-type ion implantation 14.

Figure 3:
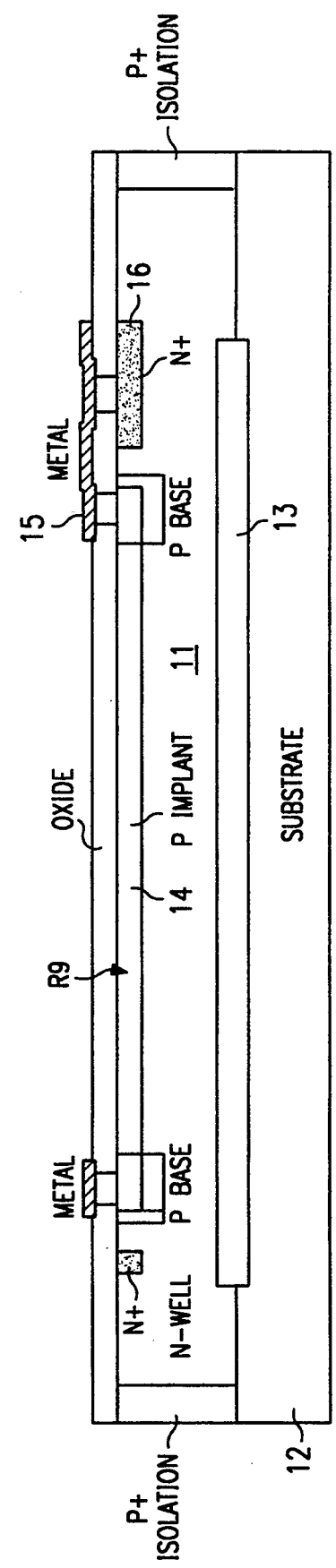
FIG. 3 is a vertical section view, taken along section line III—III, showing schematically the detail of FIG. 2.

Shown schematically in FIG. 3 is an enlarged scale vertical section of the semiconductor integrated circuit incorporating said resistors.

As can be seen, the N-P junction between the epitaxial well 11 and each resistor $R_9$, $R_{10}$ constitutes a parasitic diode.

Advantageously, according to the invention, this parasitic diode is connected in parallel with its corresponding degenerative resistor through a contact region 16, doped N+, and a metallization layer 15.

More particularly, a first diode $D_1$ is connected in parallel with resistor $R_9$, and a second diode $D_2$ is in parallel with the other resistor $R_{10}$.

These connections are implemented substantially by forward biasing the P-N junction. That is, the epitaxial well 11 which contains the resistors $R_9$ and $R_{10}$ is biased to the lowest of the potentials applied to the resistors (i.e. ground).

The diodes $D_1$ and $D_2$ are, in turn, forward biased to a potential of about 200 millivolts.

As is well-recognized, at room temperature, the threshold voltage for a P-N junction is in the neighborhood of 600-700 millivolts; accordingly, the connection provided by this invention will introduce no perturbation in the amplifier operation.

In the event, as described in the preamble to this application, of a particular operating condition being met which involves deep sudden variations in the supply voltage, the circuit structure of this invention would then be able to prevent the transistor $Q_{12}$ driving the gain stage 7 from becoming saturated.

Specifically, should such a particular operating condition result in high currents flowing through the transistors $Q_3$, $Q_5$ and $Q_6$, then the voltage across the resistors $R_9$ and $R_{19}$ would still be locked to a value of about 600 millivolts by the diodes $D_1$, $D_2$ respectively provided in the epitaxial well 11.

In this way a possible saturation of transistor $Q_{12}$ is avoided, and with it, the latching up of the amplifier.

Transistors $Q_1$-$Q_{12}$ are all of equal area in the presently preferred embodiment, except that transistor $Q_{10}$ can be made twice as large as the others by appropriately selecting the value of resistor $R_6$.

It should be noted that the solution proposed by this invention solves the technical problem in substantially the opposite way from what the prior art has suggested. Conventionally, any parasitic diodes in the integrated circuit would be biased to a potential higher than the one applied to the resistors so that such diodes are cut off.

The solution proposed by this invention avoids instead the latch-up phenomenon without resorting to the use of any additional components and while minimizing the surface area occupied by the integrated circuit.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It should be noted, in particular, that the disclosed complementary resistor structure can be used advantageously for emitter resistors in other balanced circuits. Thus, the novelty and advantages of the disclosed configuration of FIG. 2 are not by any means limited to the specific circuit of FIG. 1, nor even to circuits which are generally analogous to that of FIG. 1. The device configuration of FIG. 2 can be used advantageously wherever paired emitter resistors is needed.

Figure 2:
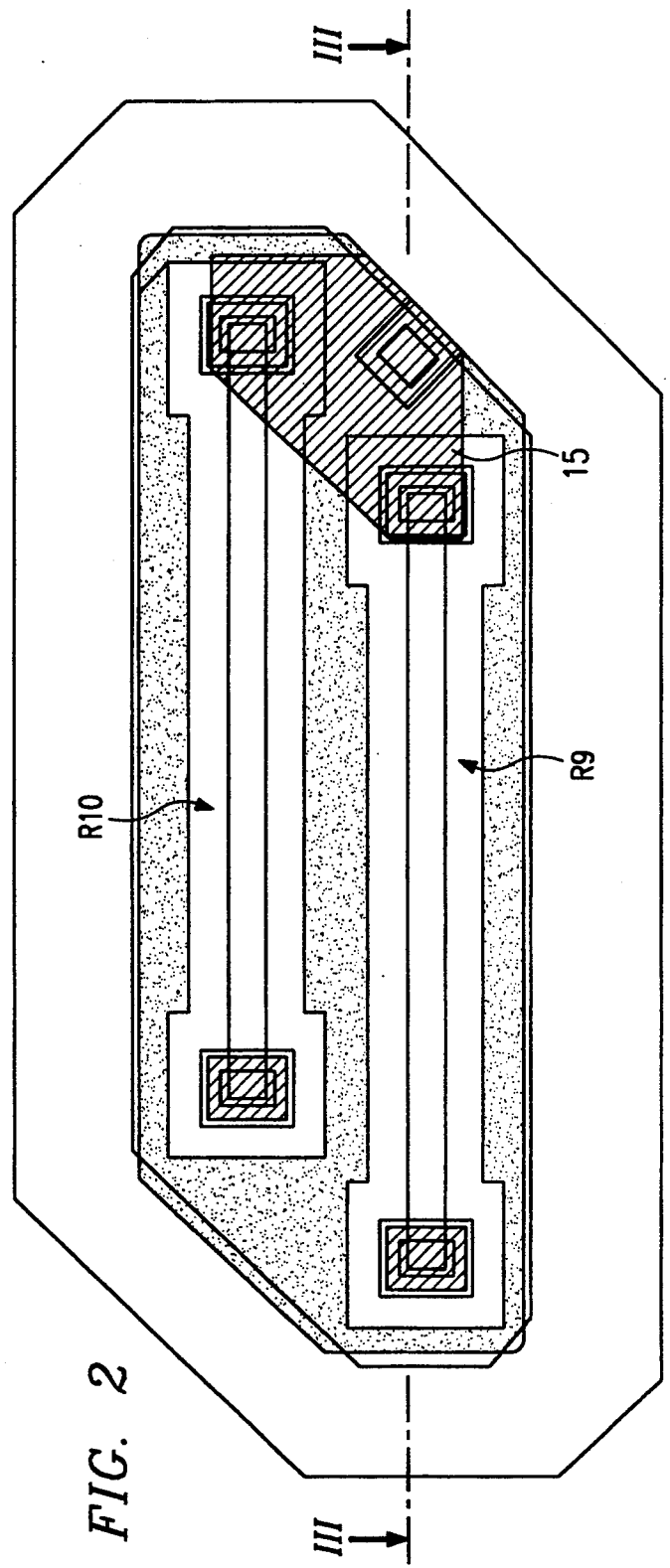
FIG. 2 is a top plan view, drawn to an enlarged scale, of a detail of a monolithically integrated circuit included to the amplifier of this invention.

For example, although the circuit of FIG. 1 uses a single-ended input, it will be readily recognized by those skilled in the art that this circuit could be modified to provide a complementary input on the base of $Q_4$, instead of the feedback connection illustrated.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   first and second matched branches, each said branch including respective first and second transistors, both said first transistors having respective control terminals which are connected in common, and at least one said second transistor being connected to receive an input signal;

each said first transistor having a second terminal thereof connected through a respective degeneration resistor to a node which is common to said first and second branches;

wherein said degeneration resistors are each formed by a diffusion of first conductivity type within a shared monolithic semiconductor well region of a second conductivity type; and wherein said well region overlies a buried layer of said second conductivity type which is more heavily doped than said well region; and wherein said well region and said buried layer overlie a deeper region which is doped with said first conductivity type; and wherein said well region is laterally surrounded by a diffusion of said first conductivity type; and wherein no active devices are located in said well region with said resistors;

and further comprising biasing circuitry connected to bias said first transistors at a level such that the junction between said first conductivity-type diffusion and said well region limits the voltage across said degeneration resistors and thereby prevents said transistors from going into saturation.

2. The integrated circuit of claim 1, wherein only one of said second transistors is connected to receive an input signal.

3. The integrated circuit of claim 1, wherein said second transistor in said first branch, but not said second transistor in said second branch, is connected to receive an input signal; and wherein said first transistor in said second branch is connected to drive a gain stage.

4. The integrated circuit of claim 1, wherein said first and second transistors have a common majority-carrier conductivity type.

5. The integrated circuit of claim 1, further comprising, in each said branch, a third transistor interposed between said first and second transistors, both said third transistors having respective control terminals which are connected in common.

6. The integrated circuit of claim 1, further comprising, in each said branch, a third transistor interposed between said first and second transistors, both said third transistors having a majority-carrier conductivity type opposite to that of said first and second transistors.

7. The integrated circuit of claim 1, wherein said well region is laterally surrounded by a heavily doped diffusion of said first conductivity type.

8. The integrated circuit of claim 1, wherein said first transistors are connected in a current mirror relationship such that one mirrors the current passed by the other.

9. An integrated circuit, comprising:
two matched bipolar transistors having respective bases thereof connected in common;

each said transistor having an emitter thereof connected through a respective emitter degeneration resistor to a common node;

wherein said degeneration resistors are each formed by a diffusion of first conductivity type within a shared monolithic semiconductor well region of a second conductivity type; and wherein said well region overlies a buried layer of said second conductivity type which is more heavily doped than said well region; and wherein said well region and said buried layer overlie a deeper region which is doped with said first conductivity type; and wherein said well region is laterally surrounded by a diffusion of said first conductivity type; and wherein no active devices are located in said well region with said resistors;

and further comprising biasing circuitry connected to bias said bipolar transistors at a level such that the junction between said first conductivity-type diffusion and said well region limits the voltage across said degeneration resistors and thereby prevents said transistors from going into saturation.

10. The integrated circuit of claim 9, wherein said bipolar transistors are connected in a current mirror relationship such that one mirrors the current passed by the other.

11. The integrated circuit of claim 9, wherein said well region is laterally surrounded by a heavily doped diffusion of said first conductivity type.

12. The integrated circuit of claim 9, wherein said bipolar transistors have a common majority-carrier conductivity type.

13. The integrated circuit of claim 12, wherein said bipolar transistors are both npn.

14. An integrated circuit, comprising:
first and second matched branches, each said branch including respective first and second transistors, both said first transistors having respective control terminals which are connected in common, and at least one said second transistor being connected to receive an input signal;

each said first transistor having a second terminal thereof connected through a respective degeneration resistor to a node which is common to said first and second branches;

wherein said degeneration resistors are each formed by a diffusion of first conductivity type within a shared monolithic semiconductor well region of a second conductivity type; and wherein no active devices are located in said well region with said resistors;

and further comprising biasing circuitry connected to bias said first transistors at a level such that the junction between said first conductivity-type diffusion and said well region limits the voltage across said degeneration resistors and thereby prevents said transistors from going into saturation.

15. The integrated circuit of claim 14, wherein only one of said second transistors is connected to receive an input signal.

16. The integrated circuit of claim 14, wherein said second transistor in said first branch, but not said second transistor in said second branch, is connected to receive an input signal; and wherein said first transistor in said second branch is connected to drive a gain stage.

17. The integrated circuit of claim 14, wherein said first transistors are connected in a current mirror relationship such that one mirrors the current passed by the other.

18. The integrated circuit of claim 14, wherein said well region overlies a buried layer of said second conductivity type which is more heavily doped than said well region.

19. The integrated circuit of claim 14, wherein said well region and said buried layer overlie a deeper region which is doped with said first conductivity type.

20. The integrated circuit of claim 14, wherein said well region is laterally surrounded by a diffusion of said first conductivity type.

21. The integrated circuit of claim 14, wherein said first and second transistors have a common majority-carrier conductivity type.

22. The integrated circuit of claim 14, further comprising, in each said branch, a third transistor interposed between said first and second transistors, both said third transistors having respective control terminals which are connected in common.

23. The integrated circuit of claim 14, further comprising, in each said branch, a third transistor interposed between said first and second transistors, both said third transistors having a majority-carrier conductivity type opposite to that of said first and second transistors.

24. An integrated circuit, comprising:
two matched bipolar transistors having respective bases thereof connected in common;
each said transistor having an emitter thereof connected through a respective emitter degeneration resistor to a common node;
wherein said degeneration resistors are each formed by a diffusion of first conductivity type within a shared monolithic semiconductor well region of a second conductivity type; and wherein no active devices are located in said well region with said resistors;
and further comprising biasing circuitry connected to bias said bipolar transistors at a level such that the junction between said first conductivity-type diffusion and said well region limits the voltage across said degeneration resistors and thereby prevents said transistors from going into saturation.

25. The integrated circuit of claim 24, wherein said bipolar transistors are connected in a current mirror relationship such that one mirrors the current passed by the other.

26. The integrated circuit of claim 24, wherein said well region overlies a buried layer of said second conductivity type which is more heavily doped than said well region.

27. The integrated circuit of claim 24, wherein said well region and said buried layer overlie a deeper region which is doped with said first conductivity type.

28. The integrated circuit of claim 24, wherein said well region is laterally surrounded by a diffusion of said first conductivity type.

29. The integrated circuit of claim 24, wherein said bipolar transistors have a common majority-carrier conductivity type.

30. The integrated circuit of claim 29, wherein said bipolar transistors are both npn.

31. An operational amplifier of a type which comprises a differential cell transconductor input stage incorporating a current mirror provided with a pair of degenerative resisters, and a gain stage driven directly by a transistor in said mirror, wherein each degenerative resistor is implemented within an epitaxial well wherewith a parasitic diode is associated, and each said diode is connected in parallel with a corresponding one of said resisters.

32. An amplifier according to claim 31, wherein one of said diodes is connected between the emitter of said transistor and ground.

33. An amplifier according to claim 31, wherein said epitaxial well is doped N-type, whereas said resisters are doped P-type.

34. An amplifier according to claim 31, wherein each diode is connected between the emitter of a corresponding transistor in said mirror and ground.

35. An amplifier according to claim 31, wherein said diodes are forward biased to a voltage of about 200 millivolts.

36. An amplifier according to claim 31, wherein said diodes are connected to their corresponding resistor through a contact region and a metallization layer.

* * * * *